(12) United States Patent  (10) Patent No.: US 8,022,517 B2
Yoon et al.  (45) Date of Patent: Sep. 20, 2011

(54) SEMICONDUCTOR CHIP PACKAGE

(75) Inventors: Sung-Hwan Yoon, Cheonan-si (KR);
Sang-Wook Park, Cheonan-si (KR);
Min-Young Son, Asan-si (KR)

(73) Assignee: SAMSUNG Electronics Co., Ltd.,
Suwon-si (KR)

( * ) Notice: Subject to any disclaimer, the term of this patent is extended or adjusted under 35 U.S.C. 154(b) by 245 days.

(21) Appl. No.: 12/266,765

(22) Filed: Nov. 7, 2008

(65) Prior Publication Data

US 2009/0121332 A1 May 14, 2009

(51) Int. Cl.
*H01L 23/495* (2006.01)
(52) U.S. Cl. ........ 257/676; 257/670; 257/671; 257/672; 257/674; 257/E23.034; 257/E23.038; 257/E23.06
(58) Field of Classification Search .......... 257/666–677, 257/685, 686, 723, 777, E25.005, E25.011, 257/E25.012, E25.13, E25.015, E25.016, 257/E25.02, E25.021, E25.026, E25.027, 257/E23.085, E23.004, E23.043–E23.05, 257/690, 692, E23.031, E23.032, E23.039, 257/E23.049, E23.06, E23.061, E23.068; 438/111, 112, 123, FOR. 366, FOR. 367, 438/FOR. 377, FOR. 380
See application file for complete search history.

(56) References Cited

U.S. PATENT DOCUMENTS

| 7,339,257 | B2 * | 3/2008 | Ozawa et al. | 257/666 |
| 7,816,775 | B2 * | 10/2010 | Wang et al. | 257/686 |
| 2006/0281228 | A1 | 12/2006 | Li et al. | |
| 2007/0132084 | A1 | 6/2007 | Sung et al. | |
| 2008/0048301 | A1 * | 2/2008 | Wang et al. | 257/666 |

FOREIGN PATENT DOCUMENTS

KR 2002-5935 1/2002

* cited by examiner

*Primary Examiner* — Jasmine Clark
(74) *Attorney, Agent, or Firm* — Stanzione & Kim, LLP

(57) ABSTRACT

A semiconductor chip package includes a lead frame, an insulation member, a chip, bonding wires and a sealing member. The lead frame includes a plurality of first leads and a plurality of second leads. The second leads have a chip adhesion region. The insulation member fills a space between the second leads in the chip adhesion region. The chip is provided on at least one surface of the insulation member. The chip has single-side bonding pads. The bonding wires electrically connect the leads and the bonding pads. The sealing member covers the lead frame, the insulation member, the chip and the bonding wires. Since the space between the second leads is filled with the insulation member, voids may be prevented from occurring.

8 Claims, 5 Drawing Sheets

SEMICONDUCTOR CHIP PACKAGE

CROSS-REFERENCE TO RELATED APPLICATIONS

This application claims priority under 35 USC §119 to Korean Patent Application No. 2007-114228, filed on Nov. 9, 2007 in the Korean Intellectual Property Office (KIPO), the contents of which are herein incorporated by reference in its entirety.

BACKGROUND OF THE INVENTION

1. Field of the Invention

Example embodiments relate to a semiconductor chip package, and a method of manufacturing the semiconductor chip package. More particularly, example embodiments relate to a semiconductor chip package on which a semiconductor chip having single-side bonding pads is mounted, and a method of manufacturing the semiconductor chip package.

2. Description of the Related Art

Nowadays, interest is increasing in decreasing a chip size and improving the electrical characteristics of chips according to decreasing design rules of semiconductor devices. A chip having single-side bonding pads has been developed to decrease a chip size and improve chip electrical characteristics. In addition, a lead frame to which the chip is adhered has been developed.

The lead frame includes a plurality of first leads and a plurality of second leads. The chip having single-side bonding pads is adhered to the second leads. As such, chips may be adhered to one surface or both surfaces of the second leads.

When chips are adhered to both surfaces of the second leads, there exists a long and narrow space between the second leads. Since the space is long and narrow, a sealing member for covering the chip and the lead frame may not completely cover the space. Accordingly, voids and air pockets may occur within the semiconductor chip package to cause defects of the semiconductor chip package.

SUMMARY OF THE INVENTION

Example embodiments provide a semiconductor chip package capable of preventing voids from occurring between leads of a lead frame where a chip having single-side bonding pads is adhered.

Example embodiments provide a method of manufacturing the semiconductor chip package.

Additional aspects and utilities of the present general inventive concept will be set forth in part in the description which follows and, in part, will be obvious from the description, or may be learned by practice of the general inventive concept.

According to some example embodiments, there is provided a semiconductor chip package. The semiconductor chip package includes a lead frame, an insulation member, at least one chip, a plurality of bonding wires and a sealing member. The lead frame includes a plurality of first leads and a plurality of second leads, the second leads having a chip adhesion region, and the second leads being longer than the first leads. The insulation member fills a space between the second leads in the chip adhesion region. The chip is provided on at least one surface of the insulation member, the chip having single-side bonding pads. The bonding wires electrically connect the leads and the bonding pads. The sealing member covers the lead frame, the insulation member, the chip and the bonding wires.

In an example embodiment, the bonding pads of the chip may be adjacent to the first leads.

In another example embodiment, the size of the insulation member may be the same as or larger than that of the chip.

In still another example embodiment, the thickness of the insulation member may be the same as or larger than that of the second leads.

In still another example embodiment, the insulation member may include at least one selected from the group consisting of polyimide resin, bismaleimide triazine (BT) resin and fiberglass-reinforced resin.

According to some example embodiments, there is provided a method of manufacturing a semiconductor chip package. In the method of manufacturing a semiconductor chip package, a lead frame including a plurality of first leads and a plurality of second leads is prepared. The second leads have a chip adhesion region. The second leads may be longer than the first leads. A space between the second leads in the chip adhesion region is filled with an insulation member. At least one chip is adhered to at least one surface of the insulation member, the chip having single-side bonding pads. The leads are electrically connected to the bonding pads by a plurality of bonding wires. The lead frame, the insulation member, the chip and the bonding wires are covered with a sealing member.

In an example embodiment, filling the insulation member may include contacting the insulation member with at least one surface of the second leads in the chip adhesion region, and heating and pressing the insulation member to fill the space between the second leads in the chip adhesion region.

In another example embodiment, the bonding pads of the chip may be adjacent to the first leads.

In still another example embodiment, the size of the insulation member may be the same as or larger than that of the chip.

In still another example embodiment, the thickness of the insulation member may be the same as or larger than that of the second lead.

In still another example embodiment, the insulation member may include at least one selected from the group consisting of polyimide resin, bismaleimide triazine (BT) resin and fiberglass-reinforced resin.

According to some example embodiments, there is provided a semiconductor chip package. The semiconductor chip package includes a substrate, a plurality of leads, at least one chip, a plurality of bonding wires and a sealing member. The substrate has wirings. The leads include first leads provided at a first end of the substrate and second leads provided at a second end that is opposite to the first end of the substrate, the second leads being electrically connected to the wirings. The chip is provided on at least one surface of the substrate, the chip including single-side bonding pads. The bonding wires electrically connect the bonding pads to the first leads and the wirings. The sealing member covers the substrate, the leads, the chip and the bonding wires.

In an example embodiment, the bonding pads of the chip may be adjacent to the first leads.

In another example embodiment, the size of the substrate may be larger than that of the chip.

According to some example embodiments, there is provided a method of manufacturing a semiconductor chip package. In the method of manufacturing a semiconductor chip package, a substrate having wirings is prepared. First leads are provided at a first end of the substrate and second leads are provided at a second end that is opposite to the first end of the substrate, the second leads being electrically connected to the wirings. At least one chip is provided on at least one surface of the substrate, the chip including single-side bonding pads. The bonding pads are electrically connected to the first leads and the wirings by a plurality of bonding wires. The substrate, the leads, the chip and the bonding wires are covered with a sealing member.

In an example embodiment, the bonding pads of the chip may be adjacent to the first leads.

According to some example embodiments, a space between second leads of a lead frame is filled with an insulation member, or the lead frame is replaced with a substrate having wirings, such that voids may be prevented from occurring when a sealing member is sealed. Accordingly, defects of a semiconductor chip package may be prevented to thereby increase the reliability of the semiconductor chip package and a process of manufacturing the semiconductor chip package.

According to some example embodiments, there is provided a semiconductor chip package, including a substrate including a plurality of wirings embedded therein, first and second sets of leads connected to the plurality of wirings, at least one chip adhered to one or both sides of the substrate, each chip including single-side bonding pads thereon, bonding wires connecting the bonding pads and leads, and a sealing member covering the substrate including the plurality of wirings, the at least one chip, the bonding pads and a portion of the first and second leads where the bonding wires are connected.

BRIEF DESCRIPTION OF THE DRAWINGS

Example embodiments will be more clearly understood from the following detailed description taken in conjunction with the accompanying drawings. FIGS. 1 to 6C represent non-limiting, example embodiments as described herein.

FIG. 1 is a cross-sectional view illustrating a semiconductor chip package in accordance with an example embodiment of the present general inventive concept.

FIG. 2 is a plan view illustrating the semiconductor chip package in FIG. 1.

FIG. 4 is a cross-sectional view illustrating a semiconductor chip package in accordance with another example embodiment of the present general inventive concept.

FIG. 5 is a plan view illustrating the semiconductor chip package in FIG. 4.

FIGS. 6A to 6C are views illustrating a method of manufacturing the semiconductor chip package in FIG. 4.

DETAILED DESCRIPTION OF THE PREFERRED EMBODIMENTS

Figure 1:
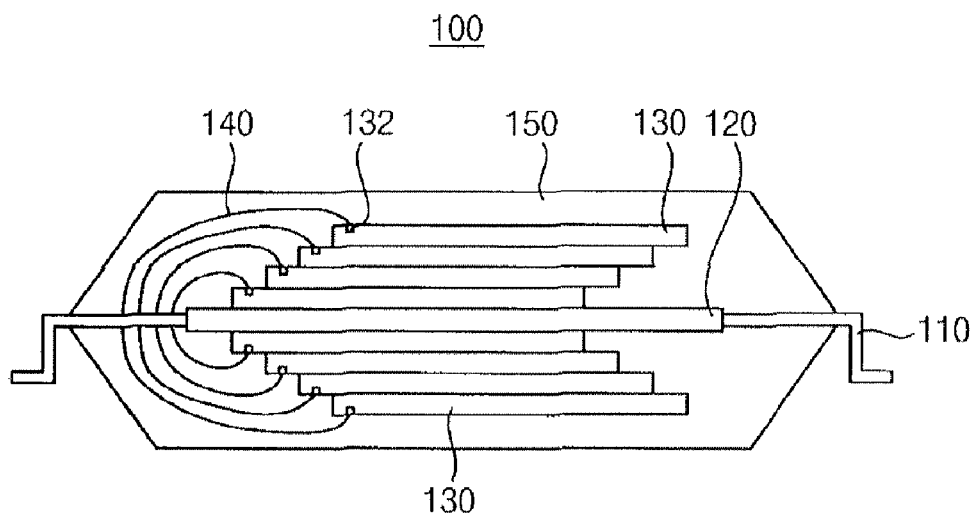

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present general inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the general inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
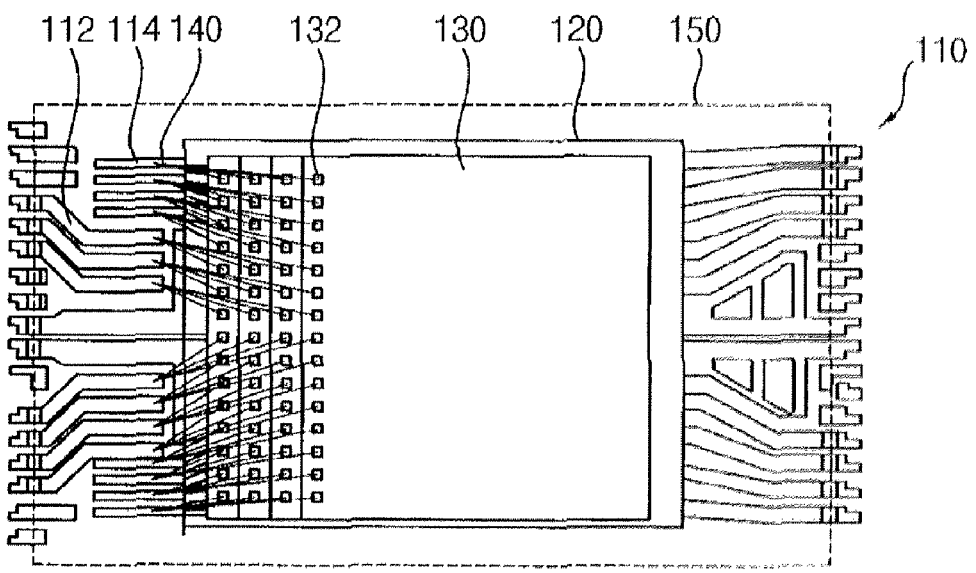

FIG. 1 is a cross-sectional view illustrating a semiconductor chip package in accordance with an example embodiment of the present general inventive concept. FIG. 2 is a plan view illustrating the semiconductor chip package in FIG. 1.

Referring to FIGS. 1 and 2, a semiconductor chip package 100 includes a lead frame 110, an insulation member 120, a chip 130, a bonding wire 140 and a sealing member 150.

The lead frame 110 includes a plurality of first leads 112 and a plurality of second leads 114. The second leads 114 may be longer than the first leads 112. The first leads 112 are disposed at a first side of the lead frame 110. The second leads 114 are disposed at a second side that can be opposite to first side of the lead frame 110. The second leads 114 extend around the first leads 112. The second leads 114 do not make contact with the first leads 112. The second leads 114 have a chip adhesion region. The chip adhesion region may be positioned in the middle of the second leads 114. For example, the chip adhesion region may be disposed at a center portion of each of the second leads 114.

The insulation member 120 is provided with the second leads 114. The insulation member 120 fills a space between the second leads 114 in the chip adhesion region. The insulation member 120 has a flat surface. The insulation member 120 is provided in the chip adhesion region to expose both end portions of the second leads 114. To fill the space completely, the thickness of the insulation member 120 may be the same as or greater than that of the second leads 114. When the thickness of the insulation member 120 is greater than that of the second leads 114, the insulation member 120 protrudes from the surfaces of the second leads 114 (i.e., the insulation member 120 can extend above the surfaces of the second leads 114). When the thickness of the insulation member 120 is the same as that of the second leads 114, the insulation member 120 may have a height substantially the same as that of the second leads 114.

For example, the insulation member 120 may include polyimide resin, bismaleimide triazine (BT) resin, fiberglass-reinforced resin, etc.

The chip 130 includes a plurality of bonding pads 132 to receive an external signal or to output a processed signal. The bonding pads 132 are disposed along a side of an upper surface of the chip 130. Accordingly, the chip 130 has single-side bonding pads 132.

Chips 130 can be adhered to at least one surface of the insulation member 120. For example, the chips 130 may be adhered to one surface or both surfaces of the insulation member 120. Furthermore, one chip 130 or a plurality of the stacked chips 130 may be adhered to each surface of the insulation member 120. When a plurality of the chips 130 is stacked, the bonding pads 132 of the chips 130 are respectively exposed.

The size of the chip 130 may be the same or smaller than that of the insulation member 120. Accordingly, the chip 130 may be easily adhered to the insulation member 120 or stacked thereon.

The bonding pads 132 of the chip 130 are electrically connected to the first leads 112 and the second leads 114 by bonding wires 140. Because the bonding pads 132 are adjacent to the first leads 112, the lengths of the bonding wires 140 may be decreased.

The sealing member 150 covers the lead frame 110, the insulation member 120, the chip 130 and the bonding wires 140. End portions of the first leads 112 and end portions of the second leads 114 in the lead frame 110 are exposed to the outside of the sealing member 150. The sealing member 150 may protect the lead frame 110, the insulation member 120, the chip 130 and the bonding wires 140 from external impacts. For example, the sealing member 150 may include an epoxy resin.

Because the insulation member 120 fills the spaces between the second leads 114 in the chip adhesion region, the sealing member 150 may easily fill other spaces between the second leads 114 and spaces between the first leads 112. Accordingly, the sealing member 150 may cover the lead frame 110, the insulation member 120, the chip 130 and the bonding wires 140 without voids occurring.

FIGS. 3A to 3D are views illustrating a method of manufacturing the semiconductor chip package in FIG. 1.

Figure 3A:
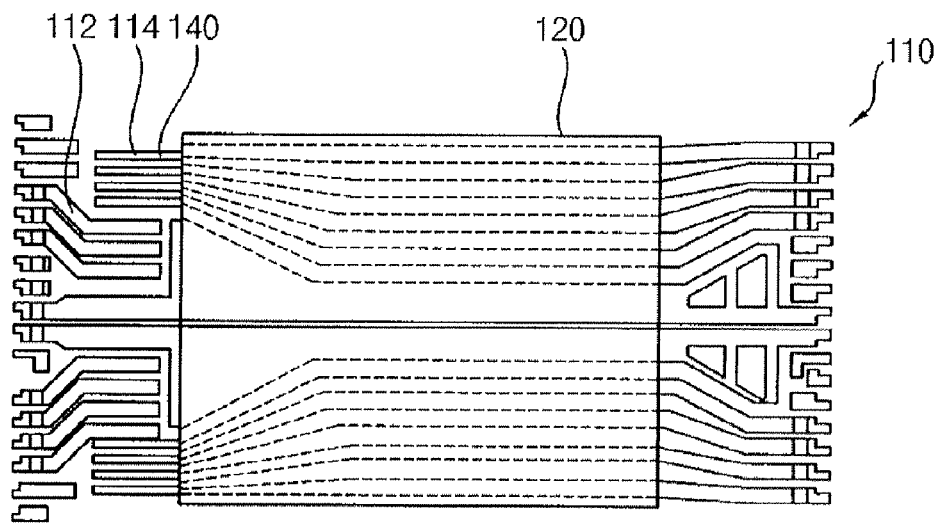
FIGS. 3A to 3D are views illustrating a method of manufacturing the semiconductor chip package in FIG. 1.

Referring to FIG. 3A, a lead frame 110 including a plurality of first leads 112 and a plurality of second leads 114 having a chip adhesion region is prepared. The second leads 114 may be longer than the first leads 112. The first leads 112 are disposed at a first side of the lead frame 110. The second leads 114 are disposed at a second side that can be opposite to first side of the lead frame 110. The second leads 114 extend around the first leads 112. The second leads 114 do not make contact with the first leads 112. The chip adhesion region can be positioned in the middle of the second leads 114.

An insulation member 120 is adhered to the chip adhesion region of the second leads 114. For example, the insulation member 120 may make contact with first surfaces of the second leads 114. Alternatively, the insulation member 120 may make contact with both first and second surfaces of the second leads 114. The insulation member 120 may be heated and pressed to fill a space between the second leads 114. Then, the insulation member 120 filling the space may have a flat surface.

The insulation member 120 is provided in the chip adhesion region of the second leads 114 to expose both end portions of the second leads 114. To fill the space completely, the thickness of the insulation member 120 may be the same as or greater than that of the second leads 114. When the thickness of the insulation member 120 is greater than that of the second lead 114, the insulation member 120 protrudes from the surfaces of the second leads 114. When the thickness of the insulation member 120 is the same as that of the second leads 114, the insulation member 120 may have a height substantially the same as that of the second leads 114.

The insulation member 120 may include polyimide resin, bismaleimide triazine (BT) resin, fiberglass-reinforced resin, etc.

Figure 3B:
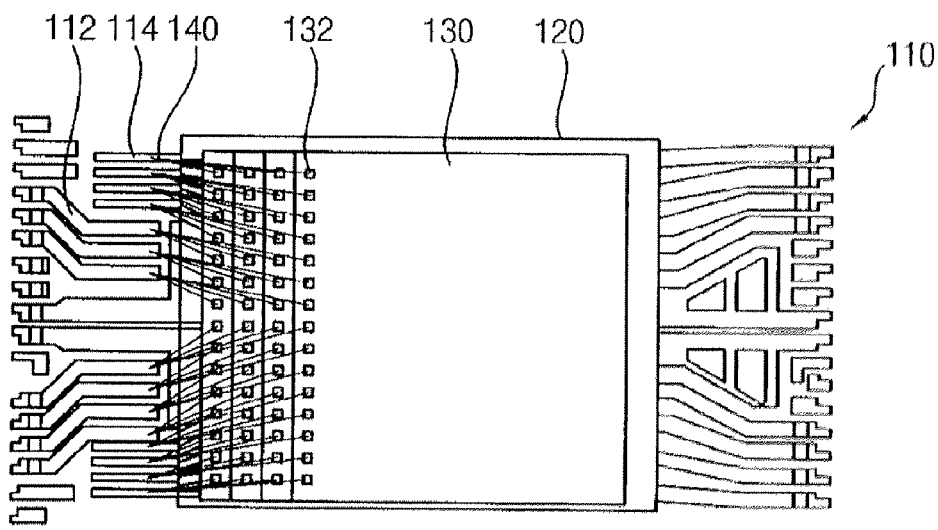
Figure 3C:
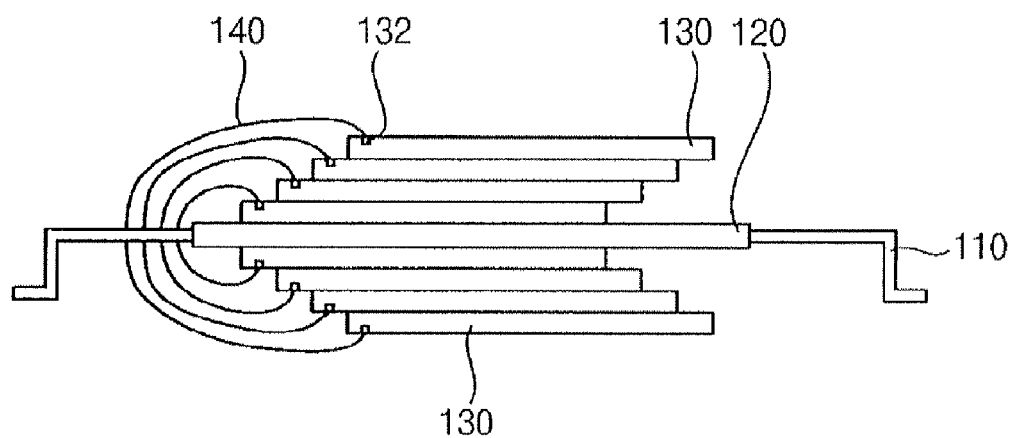

Referring to FIGS. 3B and 3C, a chip 130 having single-side bonding pads 132 is adhered to the insulation member 120. The bonding pads 132 of the chip 130 that is adhered to the insulation member 120 are adjacent to the first leads 112. Chips 130 may be adhered to a surface or both surfaces of the insulation member 120 (see, for example, FIG. 3C). One chip 130 or a plurality of the stacked chips 130 may be adhered to the insulation member 120. When the chips 130 are stacked, the bonding pads 132 of the chips 130 are respectively exposed.

The size of the chip 130 may be the same or smaller than that of the insulation member 120. Accordingly, the chip 130 (or a plurality of chips 130) may be easily adhered to the insulation member 120 or stacked thereon.

Then, the bonding pads 132 of the chip 130 are electrically connected to the first leads 112 and the second leads 114 by bonding wires 140. Because the bonding pads 132 are adjacent to the first leads 112, the lengths of the bonding wires 140 may be made short.

Figure 3D:
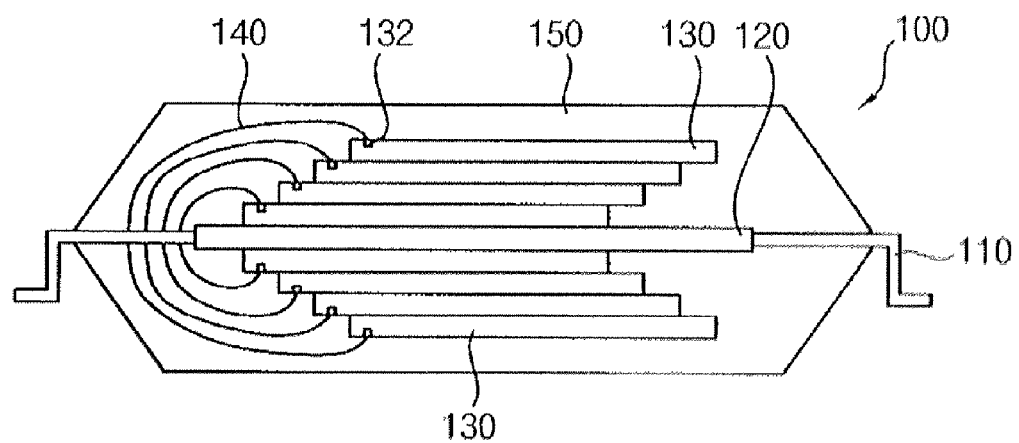

Referring to FIG. 3D, the lead frame 110, the insulation member 120, the chip 130 and the bonding wires 140 are covered with a sealing member 150 such as epoxy resin. End portions of the first leads 112 and end portions of the second leads 114 in the lead frame 110 are exposed to the outside of the sealing member 150. The sealing member 150 may protect the lead frame 110, the insulation member 120, the chip 130 and the bonding wires 140 from external impacts.

Figure 4:
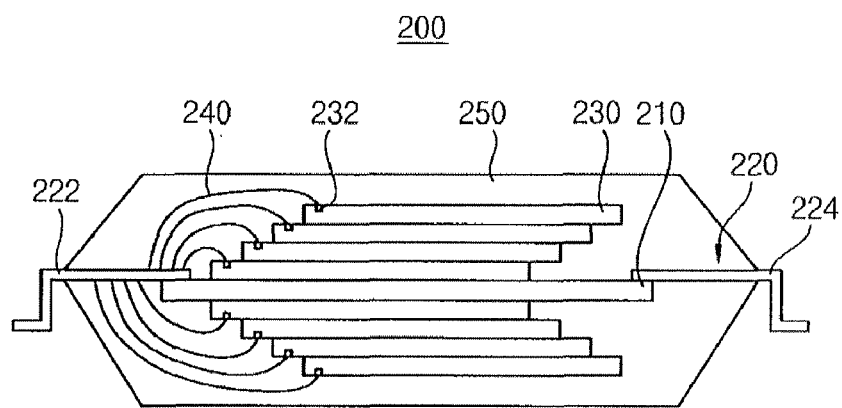
Figure 5:
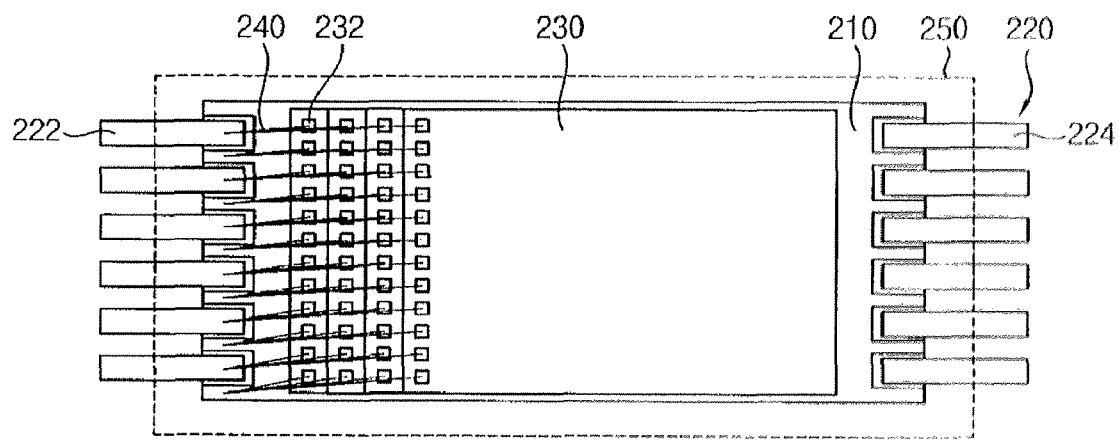

FIG. 4 is a cross-sectional view illustrating a semiconductor chip package in accordance with another example embodiment of the present general inventive concept. FIG. 5 is a plan view illustrating the semiconductor chip package in FIG. 4.

Referring to FIGS. 4 and 5, a semiconductor chip package 200 accordingly to an exemplary embodiment includes a substrate 210, leads 220, a chip 230, bonding wires 240 and a sealing member 250.

The substrate 210 has a plurality of wirings therein. The wirings extend along a first direction. The wirings may be parallel with one another. The wirings may not be connected to one another.

The leads 220 include first leads 222 and second leads 224.

The first leads 222 are provided at a first end of the substrate 210 along the direction where the wirings extend in the substrate 210. The first leads 222 may not be connected to the wirings. The second leads 224 are provided at a second end that is opposite to the first end of the substrate 210. The second leads 224 are respectively connected to the wirings.

The chip 230 may be a single-side bonding pad chip having single-side bonding pads 232 at a side of an upper surface thereof. Chips 230 may be adhered to at least one of both surfaces of the substrate 210. In particular, a chip 230 may be adhered to a surface or both surfaces of the substrate 210. Furthermore, one chip 230 or a plurality of the stacked chips 230 may be adhered to each side of the substrate 210. When the chips 230 are stacked, the bonding pads 232 of the chips 230 are respectively exposed. The bonding pads 232 of the chip 230 that is adhered to the substrate 210 are adjacent to the first leads 222.

The size of the chip 230 may be smaller than that of the substrate 210. Accordingly, the chip 230 may be disposed on the substrate 210.

The bonding pads 232 of the chip 230 are electrically connected to the first leads 222 by bonding wires 240, and the bonding pads 232 of the chip 230 are electrically connected to the wirings of the substrate 210 by bonding wires 240. Because the bonding pads 232 are adjacent to the first leads 222, the lengths of the bonding wires 240 may be made short.

The sealing member 250 covers the substrate 210, the leads 220, the chip 230 and the bonding wires 240. End portions of the first leads 222 and end portions of the second leads 224 are exposed to the outside of the sealing member 250. The sealing member 250 may protect the substrate 210, the leads 220, the chip 230 and the bonding wires 240 from external impacts. For example, the sealing member 250 may include an epoxy resin.

The semiconductor chip package 200 according to the present embodiment is provided with the substrate having the wirings, instead of the lead frame having a plurality of the first and second leads. Therefore, when the sealing member is sealed, voids may be prevented from occurring, to thereby increase the reliability of the semiconductor chip package 200.

Figure 6A:
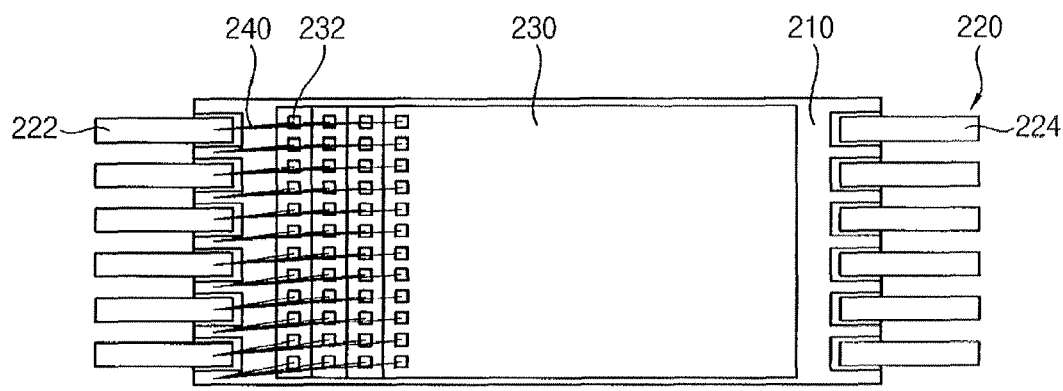
Figure 6B:
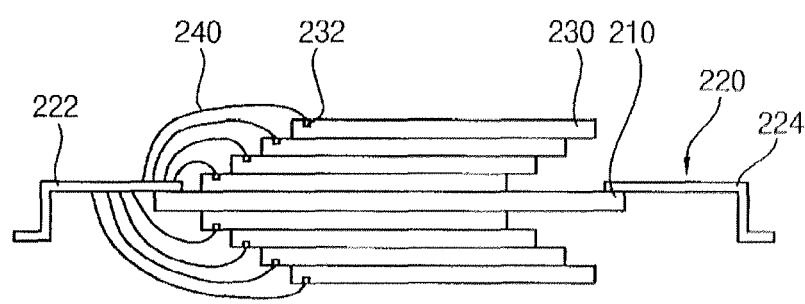
Figure 6C:
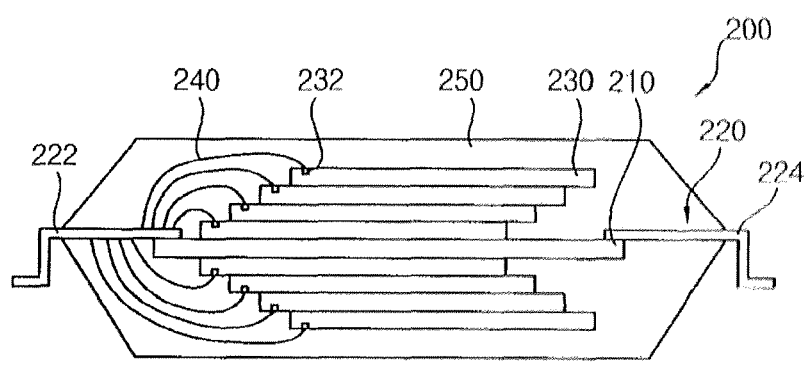

FIGS. 6A to 6C are views illustrating a method of manufacturing the semiconductor chip package in FIG. 4.

Referring to FIGS. 6A and 6B, a substrate 210 having a plurality of wirings is prepared. The wirings extend along a first direction. The wirings may not be connected to one another.

First leads 222 are provided at a first end of the substrate 210 along the direction where the wirings extend in the substrate 210. The first leads 222 may not be connected to the wirings. Second leads 224 are provided at a second end that is opposite to the first end of the substrate 210. The second leads 224 are respectively connected to the wirings.

A chip 230 having single-side bonding pads 232 is adhered to the substrate 210. The size of the chip 230 may be smaller than that of the substrate 210 such that the chip 230 may be easily disposed on the substrate 210. The bonding pads 232 of the chip 230 that is adhered to the substrate 210 are adjacent to the first leads 222.

The chip 230 may be adhered to a surface or both surfaces of the substrate 210. One chip 230 or a plurality of the stacked chips 230 may be adhered to the substrate 210. When the chips 230 are stacked, the bonding pads 232 of the chips 230 are respectively exposed.

Then, the bonding pads 232 of the chip 230 are electrically connected to the first leads 222 using bonding wires 240. The bonding pads 232 of the chip 230 are electrically connected to the wirings of the substrate 210 using bonding wires 240. Because the bonding pads 232 are adjacent to the first leads 222, the lengths of the bonding wires 240 may be decreased.

Referring to FIG. 6C, the substrate 210, the leads 220 including the first leads 222 and the second leads 224, the chip 230 and the bonding wires 240 are covered with a sealing member 250. End portions of the first leads 222 and end portions of the second leads 224 are exposed to the outside of the sealing member 250. The sealing member 250 can protect the substrate 210, the leads 220, the chip 230 and the bonding wires 240 from external impacts.

As mentioned above, according to some example embodiments of the present general inventive concept, a space between second leads of a lead frame is filled with an insulation member, or a lead frame is replaced with a substrate having wirings, such that voids may be prevented from occurring when a sealing member is sealed. Accordingly, defects of a semiconductor chip package may be prevented to thereby increase the reliability of the semiconductor chip package and a process of manufacturing the semiconductor chip package.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor chip package comprising:
   a lead frame including a plurality of first leads and a plurality of second leads, the second leads having a chip adhesion region, and the second leads being longer than the first leads;
   an insulation member filling a space between the second leads in the chip adhesion region;
   at least one chip provided on at least one surface of the insulation member, the chip having single-side bonding pads;
   a plurality of bonding wires electrically connecting at least one of the first and second leads with the bonding pads; and
   a sealing member covering the lead frame, the insulation member, the chip and the bonding wires,
   wherein the bonding pads of the chip are adjacent to the first leads.

2. The semiconductor chip package of claim 1, wherein the size of the insulation member is the same as or larger than that of the chip.

3. The semiconductor chip package of claim 1, wherein the thickness of the insulation member is the same as or larger than that of the second leads.

4. The semiconductor chip package of claim 1, wherein the insulation member comprises at least one selected from the group consisting of polyimide resin, bismaleimide triazine (BT) resin and fiberglass-reinforced resin.

5. A semiconductor chip package comprising:
   a substrate having wirings;
   a plurality of leads including first leads provided at a first end of the substrate and second leads provided at a second end that is opposite to the first end of the substrate, the second leads being electrically connected to the wirings;
   at least one chip provided on at least one surface of the substrate, the chip including single-side bonding pads;
   a plurality of bonding wires electrically connecting the bonding pads to the first leads and the wirings; and
   a sealing member covering the substrate, the leads, the chip and the bonding wires.

6. The semiconductor chip package of claim 5, wherein the bonding pads of the chip are adjacent to the first leads.

7. The semiconductor chip package of claim 5, wherein the size of the substrate is larger than that of the chip.

8. A semiconductor chip package, comprising:
   a substrate including a plurality of wirings embedded therein;
   first and second sets of leads connected to the plurality of wirings, the first leads located at a first end of the substrate and the second leads located at a second end of the substrate opposite the first end;
   at least one chip adhered to one or both sides of the substrate, each chip including single-side bonding pads thereon;
   bonding wires connecting the bonding pads to the first leads; and
   a sealing member covering the substrate including the plurality of wirings, the at least one chip, the bonding pads and a portion of the first and second leads where the bonding wires are connected.

* * * * *

UNITED STATES PATENT AND TRADEMARK OFFICE
CERTIFICATE OF CORRECTION

PATENT NO.         : 8,022,517 B2                                     Page 1 of 1
APPLICATION NO.    : 12/266765
DATED              : September 20, 2011
INVENTOR(S)        : Sung-Hwan Yoon et al.

It is certified that error appears in the above-identified patent and that said Letters Patent is hereby corrected as shown below:

On the cover page, please insert:

Section --(30) Foreign Application Priority Data
November 9, 2007  (KR).........10-2007-114228--

Signed and Sealed this
Eighth Day of May, 2012

David J. Kappos
*Director of the United States Patent and Trademark Office*